United States Patent [19]

Chang et al.

[11] 4,215,313
[45] Jul. 29, 1980

[54] DIELECTRIC IMAGE GUIDE INTEGRATED HARMONIC PUMPED MIXER

[75] Inventors: Yu-Wen Chang, Ranchos Palos Verdes; Jeffrey A. Paul, Torrance, both of Calif.

[73] Assignee: Hughes Aircraft Company, Culver City, Calif.

[21] Appl. No.: 44,782

[22] Filed: May 31, 1979

[51] Int. Cl.$^2$ .................................................. H04B 1/06
[52] U.S. Cl. .................................... 455/326; 329/160; 333/34; 333/228
[58] Field of Search ............... 325/445, 446, 449, 442, 325/437; 329/160, 161, 203, 204, 205 TD; 333/32, 34, 33, 35, 124, 128, 227, 228, 239, 253; 332/51 W

[56] References Cited

U.S. PATENT DOCUMENTS

| | | | |
|---|---|---|---|
| 3,216,017 | 11/1965 | Moore | 333/34 |
| 3,652,941 | 3/1972 | Neuf | 325/446 |
| 3,995,238 | 11/1976 | Knox et al. | 325/446 |
| 4,006,425 | 2/1977 | Chang et al. | 325/445 |
| 4,125,810 | 11/1978 | Pavio | 325/449 |

*Primary Examiner*—Robert L. Richardson
*Assistant Examiner*—Tommy P. Chin

*Attorney, Agent, or Firm*—Elliott N. Kramsky; W. H. MacAllister

[57] ABSTRACT

The specification describes a dielectric image guide harmonic pumped mixer circuit wherein two dielectric image guide strips of different chosen cross-sectional configurations are mounted on a metallic substrate which forms the image plane for the mixer circuit. These image guide strips have impedance matching tapered ends which extend into a central mixer cavity region on the substrate. A pair of reverse poled mixer diodes are mounted in the central cavity region to receive respectively RF incoming signals from one dielectric image guide and local oscillator signals from the other dielectric image guide. Differential currents generated in the two diodes cause the second harmonic of the local oscillator signal frequency to mix with the incoming RF signal frequency. An intermediate frequency (IF) signal current produced thereby is conductively coupled from the mixer cavity into IF signal processing electronics.

Advantageously, the image plane substrate surface is configured to receive, in a coplanar fashion, a modular circuit board containing electronics such as an IF amplifier, mixer, and detector which in turn are conductively coupled to the mixer diodes by a metallic strip or the like in a compact, substantially planar-upper surface configuration.

8 Claims, 3 Drawing Figures

Fig. 2b.
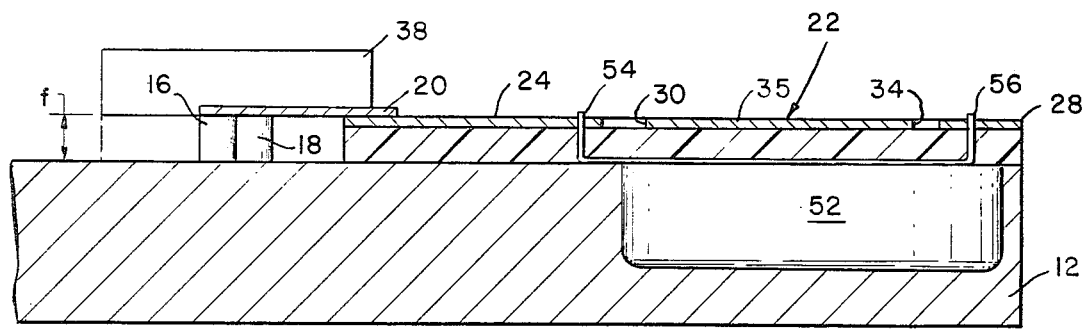
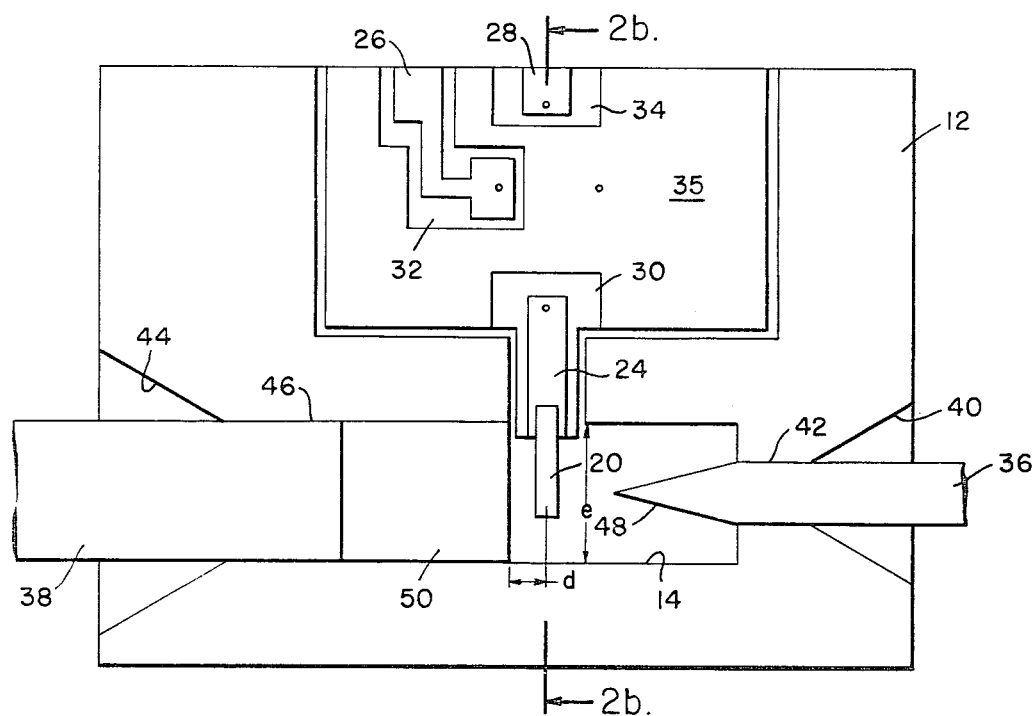
Fig. 2a.

DIELECTRIC IMAGE GUIDE INTEGRATED HARMONIC PUMPED MIXER

FIELD OF THE INVENTION

This invention relates generally to microwave and millimeter wave integrated mixer circuits and more particularly to dielectric waveguide-type integrated harmonic pumped mixers.

BACKGROUND

Hitherto, in the microwave and millimeter wave signal processing arts, the well known diode pair-hydrid coupled double balanced mixer has been used to combine an incoming radio frequency (RF) signal with a local oscillator (LO) signal in order to obtain a desired output intermediate frequency (IF) signal for further signal processing using conventional state-of-the-art IF mixers, amplifiers, detectors and the like. For example, using such a balanced mixer circuit, an RF signal of 94 GHz and a local oscillator signal of 93 GHz can both be initially coupled through a 3db coupler into a single waveguide, then channeled to individual mixer diodes of reverse polarity, and then, finally, recombined to generate an IF difference frequency signal of, for example 1 GHz for further amplification and signal processing. By using two separate diodes instead of the single diode that is often used in single ended mixers (such as the single ended mixer disclosed in U.S. Pat. No. 4,006,425 assigned to the present assignee), the local oscillator power requirement per mixer diode is substantially reduced.

Whereas the two diode balanced mixers of the type described generally above have proven satisfactory for certain kinds of millimeter wave applications, the conventional balanced mixer circuit construction most frequently used for these mixers requires that the local oscillator signal frequency be quite close to the frequency of the incoming RF signals. Thus, this requirement places a certain power output demand on the local oscillator used and therefore makes it impossible, for example, for a 20 milliwatt Gunn oscillator to drive more than about 2 balanced mixers. It is desirable in certain monopulse radar applications to have a single local oscillator drive many more than two mixer diodes to enable a single local oscillator to maintain proper phase and amplitude tracking of sum and difference IF signals. Thus, the above prior art balanced mixer circuit construction is unsuitable for such applications.

Therefore, in order to provide a mixer circuit wherein a single local oscillator is capable of driving many mixer diodes and a corresponding large plurality of antennae in certain types of monopulse radar applications, it has been previously proposed to suspend two parallel-connected mixer diodes of reverse polarity in a waveguide structure and then apply local oscillator and RF signals, respectively to opposite ends of the waveguide in order to produce differential currents in the diodes. The electromagnetic fields produced by these differential currents cause the second harmonic of the LO frequency to mix with the RF incoming signal frequency and thereby reduce by one-half the required local oscillator frequency. Since local oscillators operating at lower frequencies produce much more output power than those operating at higher frequencies, a single low frequency oscillator can now drive many mixer diodes for monopulse radar applications. Therefore, using the latter approach, a local oscillator operating at 46.5 GHz can now be used at one end of the waveguide to mix its second harmonic frequency of 93 GHz with the 94 GHz RF input signal frequency and still provide the required plus or minus 1 GHz IF output signal. Such harmonic mixing has been disclosed, for example, by Joseph M. Baird et al in U.S. Application Ser. No. 864,027, entitled "Bi-mode Millimeter Wave Mixer", and assigned to the present assignee.

The above type of diode pair suspended-in-waveguide structure has also been described in at least two other configurations. One of these configurations utilizes two reverse poled diodes connected in parallel between opposite walls of a conventional rectangular waveguide. The other configuration utilizes a pair of reverse poled diodes connected to a suspended metal plane of either a stripline or dipole structure, and this latter structure is in turn suspended in a larger waveguide structure. The first of the above suspended-in-waveguide configurations is described by M. V. Schneider and W. W. Snell in an article entitled "Stripline Down Converter With Subharmonic Pump", *Bell System Technical Journal*, Vol. 53, pages 1179–1183, July–August 1974. This first configuration is also disclosed in another article by the same authors entitled "Harmonically Pumped Stripline Down Converter", *IEEE Transactions on Microwave Theory and Techniques*, Vol. MTT-23, pages 271–275, March 1975. The other type of suspended-in-waveguide diode pair mixer configuration is described by M. Cohn, J. E. Degerford, and B. A. Newman in *IEEE Trans. Microwave Theory Tech.*, Vol. Mtt-24, pp. 254–257, May 1976, in an article entitled "Harmonic Mixing With Antiparallel Diode Pair".

Whereas these suspended-in-waveguide mixers do in fact reduce the frequency and power requirements for the local oscillator, they nevertheless are relatively expensive in design, and are generally too large and unsuitable for use at millimeter wave frequencies greater than about 100 GHz.

THE INVENTION

The general purpose of this invention is to provide a new and improved harmonic integrated mixer circuit which overcomes most, if not all, of the aforementioned disadvantages of prior diode pair mixer structures and which is suitable for operating at frequencies up to 300 GHz or greater. Furthermore, our circuit is characterized by low cost construction and low loss and high strength electrical and mechanical properties, respectively, which are not characteristic of the above suspended-in-waveguide type diode pair mixers.

To accomplish this purpose, we have discovered and therefore developed a novel dielectric image guide integrated harmonic mixer circuit which utilizes a metallic or metallic covered substrate as both a mechanical support and an image plane for the circuit. First and second dielectric image guides of different chosen heights and widths (corresponding to the frequency or frequency ranges of received RF input signals and local oscillator signals, respectively) are disposed at selected locations on this image plane. The output ends of these first and second dielectric image guides have preconfigured impedance matching tapered ends which extend into a central mixing cavity region of the circuit where a pair of parallel connected and reverse poled mixer diodes are mounted. When local oscillator and incoming Rf signals are coupled, respectively, into the input ends of these first and second dielectric image guides and then into the central cavity region, the differential currents induced in the diode mixer pair cause the second harmonic of the local oscillator frequency applied to one image guide to mix with the incoming RF signal frequency applied to the other image guide and thus generate an intermediate frequency output signal across the diode mixer pair. Thus, this configuration requires moderate to low levels of local oscillator power for driving a diode mixer pair, or conversely, one relatively high power high power local oscillator can drive a relatively large plurality of mixer diodes in multiple antenna monopulse radar applications.

Advantageously, the substrate or image plane of the mixer structure is configured to receive IF amplifier or other signal processing electronics in a modular or printed circuit board (PCB) housing and in a compact coplanar mounting arrangement. Conductive strips or the like may be utilized to conductively connect the diode mixer pair to appropriate IF amplifier electronics on such modular or PCB housing.

Accordingly, it is an object of the present invention to provide a new and improved low cost integrated harmonic pumped mixer circuit.

Another object is to provide a mixer circuit of the type described which is uniquely adapted for use with dielectric image guide types of microwave and millimeter wave integrated circuits.

Another object is to provide a mixer circuit of the type described which is uniquely adapted for use in certain monopulse radar applications requiring a large plurality of antenna elements driven by a single local oscillator.

Another object is to provide a mixer circuit of the type described which does not require bulky waveguide structures and which utilizes instead compact dielectric image guides in a compact and generally planar upper surface modular configuration of low cost construction.

A feature of this invention is the provision of a mixer circuit of the type described which utilizes a low frequency, low noise and high power local oscillator during the mixing and detection of RF signals at approximately twice the local oscillator frequency.

Another feature is the provision of a mixer circuit of the type described which utilizes a diode mixer pair with local oscillator noise and intermodulation supression capability. The two mixer diodes forming this diode pair are placed very close to each other, thereby improving the electrical matching and loading between the two diodes as a result of the diodes being exposed to the same power and phase of both the local oscillator and RF input signals coupled thereto.

Another feature of this invention is the provision of a harmonic mixer circuit of the type described which is basically broadband and which, for example, enables the detection of RF input signals over a range of 2 GHz while switching the local oscillator frequency over a range of only 1 GHz. This feature simplifies the tuning requirements for the local oscillator.

Another feature is the provision of a harmonic mixer circuit of the type described wherein no or negligible undesirable local oscillator radiation into the RF source occurs. This feature is a result of the fact that the RF input dielectric image guide strip which conducts incoming RF signals cuts off the local oscillator frequency. Thus, no significant amount of local oscillator signal is propagated back toward the RF signal source.

These and other objects and features of the present invention will become more readily apparent in the following description of the accompanying drawings.

DRAWINGS

FIGS. 2a and 2b are top and sectional views respectively of the perspective structure of FIG. 1.

DESCRIPTION OF THE PREFERRED EMBODIMENT

Figure 1:
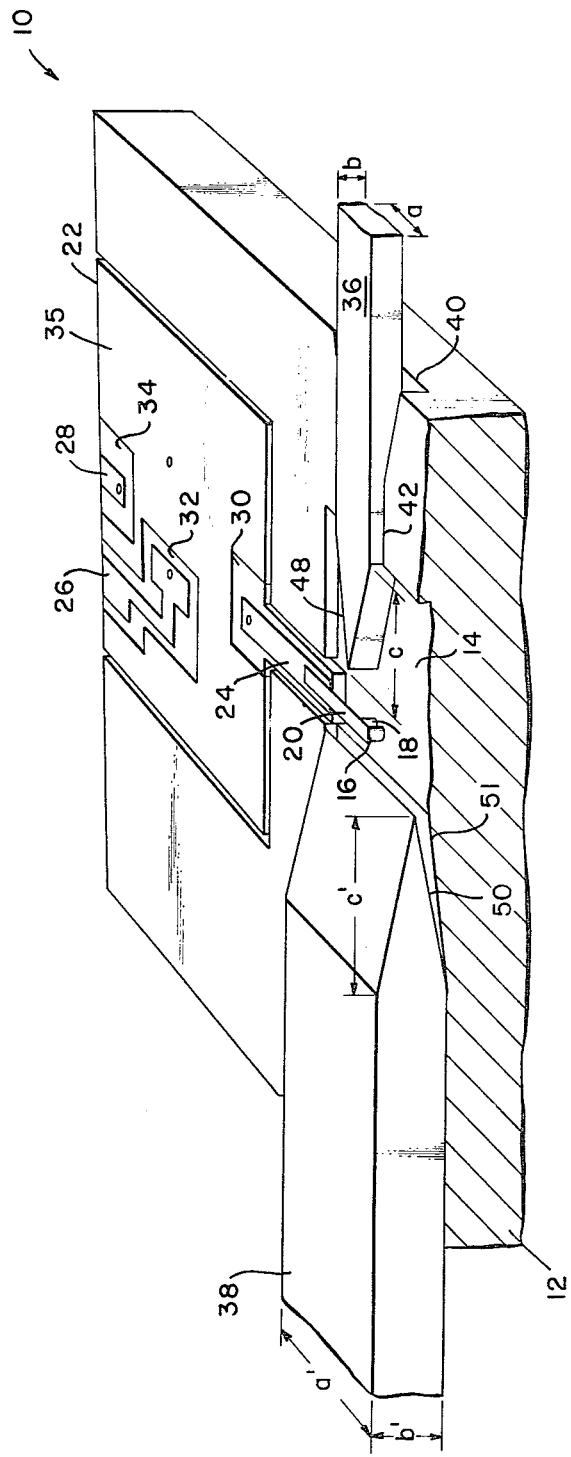
FIG. 1 is a perspective view of the dielectric image guide harmonic pumped mixer according to the invention.

Referring now to the drawings, there is shown in FIG. 1 a perspective view of the harmonic pumped mixer 10 of the present invention. The various elements of the mixer 10 are formed on a substrate 12. The substrate 12, which serves, inter alia, as an image plane, may be of either metal or metal-coated dielectric fabrication. Suitable metallic conductors include aluminum, brass or the like. Advantageously, the substrate 12 may be gold plated to enhance the low loss properties of the mixer 10. Both the electrical characteristics (such as conductivity, loss, etc.) and the mechanical properties (including sturdiness, heat transfer and the like) required for a given application may be considered in deriving the most desirable material for the substrate 12.

A number of indentations, formed by any of a number of standard etching and forming processes well known in the art, provide distinct functional regions of the substrate 12. A rectangular mixing cavity 14 is located in a central portion of the substrate 12 having a pair of reversed poled mixing diodes 16, 18 positioned therein. The diodes 16, 18, which may be Schottky barrier diodes either of the whisker contact or beam lead variety, are closely spaced with respect to (preferably separated by less than one tenth of) the wavelength of the RF signal. The close spacing (the diodes 16, 18 may, in fact, be in contact) improves the impedance matching therebetween. This is a consequence of the fact that the same power and phase of both the local oscillator and RF signal waveforms will be seen by the opposite-poled diodes 16, 18, allowing the pair to minimize the perturbations due to LO noise and intermodulation effects. Such effects may be minimized by the cancellation property of the closely-spaced anti-symmetric diode arrangement.

The diodes 16, 18 extend approximately the height of the mixing cavity 14, roughly one-half millimeter, contacting both the metallic substrate 12, which serves as electrical ground, and a ribbon 20. The ribbon 20 is a stripline or microstrip section which serves as a quasi-TEM type transmission line to conduct the IF energy from the mixing cavity 14 to a modular IF amplifier (not shown in FIG. 1) mounted on the underside of a standard printed circuit board 22 of the type formed of a planar dielectric encapsulated by a conductive cladding of copper or the like. The ribbon 20 is dimensioned with a view to (i) cutting off both the local oscillator and signal frequencies and supporting the IF so that only the desired IF is transmitted, and (ii) achieving an impedance match with the diode pair. The choice of appropriate design parameters for the above objects is well known in the art.

The ribbon 20 is in electrical contact with a stripline metallization forming a mixer output/IF amplifier input terminal 24. Additional stripline metallizations (in communication with an IF amplifier which may be seen in FIG. 2b) on the surface of the board 22 include an IF output terminal 26 and a dc bias terminal 28. The terminals 24, 26 and 28 are each located in insulative islands 30, 32, 34 which have been pattern etched by standard photolithographic techniques into the otherwise conductive cladding 35 of the circuit board 22. The (interior) conductive cladding 35 remaining on the top surface of the board 22 serves as the ground plane of the modular unit including the IF amplifier and the printed circuit board 22.

RF signal energy (at approximately 94 GHz) is applied to the mixing cavity 14 by means of a dielectric waveguide 36. The LO energy is applied by a dielectric waveguide 38. Each of the waveguides 36, 38 is substantially rectangular in cross-section and terminates in an impedance-matching taper. The waveguides 36, 38 are formed of low loss dielectric material possessing a relatively high permittivity. That is, the permittivity of the waveguide material should be two or greater with a loss tangent of less than about 0.001. Suitable waveguides may be formed from certain plastics, ceramics and semiconductor materials. Examples of fired ceramics useful in the present invention are alumina (which has a permittivity of about 10 and a loss tangent of about 0.001), titanium dioxide (having a permittivity of about 100 and a loss tangent of about 0.0005), the barium titanates (having a permittivity in the range of 300 to 2,000 and a loss tangent in the range of 0.0005 to 0.001), fused quartz (having a permittivity of about 4 and a loss tangent of about 0.0001) and ferrite material (having a permittivity from 12 to 16 and a loss tangent from 0.0006 to 0.001). Single crystal ceramics include sapphire (having a permittivity of about 11 and loss tangent of about 0.0002) and gallium arsenide (having a permittivity of about 11 and a loss tangent of about 0.0005). A synthetic organic plastic filled with one of the above specified ceramic materials may also be utilized for dielectric waveguide. In such a case, the plastic material may be polystyrene or a tetrafluoroethylene polymer such as that sold under the trademark "Teflon". Such waveguide will have a permittivity in the range of 2.2 to 25 and a loss factor of about 0.0001.

Each of the waveguides 36, 38 is fitted into a channel of and lies in intimate contact with the substrate 12, which thereby forms an image guiding plane. The cross-sectional areas of the two dielectric waveguides 36, 38 necessarily differ. This is due to the fact that the LO frequency is approximately one-half that of the RF signal. The waveguides 36, 38 must therefore cut off all modes of propagation other than the desired $E^{Y}_{11}$ fundamental waveguide mode at different frequencies. The waveguide 38, transferring energy from the LO, is necessarily of larger cross-section than the RF waveguide 36. As the cutoff frequency of the waveguide 38 is less than that of the RF signal, signal energy will not be transmitted, and lost, through the waveguide 38.

The RF waveguide 36 enters the mixer 10 through a flared indentation 40 in the substrate 12. The indentation 40 acts as an impedance transformer to aid (minimize loss from) the transition of the RF from a dielectric waveguide energy transfer mode to an image guide mode. This is followed by a channel-like indentation 42 (at least one wavelength long) which acts as a mode suppressor. The LO waveguide 38 likewise encounters a flared impedance transformer 44 followed by a mode suppressor 46 before entering the mixing cavity 14.

The dimensions critical to the functional design and operation of the harmonic pumped mixer 10 may be seen more clearly with reference to FIG. 2a, a top view of the mixer 10 of the invention, in conjunction with FIG. 1. The waveguide 36, as mentioned supra, terminates within the mixer cavity 14 in a tapered section 48. The base of the tapered section 48 coincides with the width, a, of the waveguide 36. This dimension, in conjunction with the waveguide height b, sets the aspect ratio of the waveguide 36. For a given frequency, a value of b, known as the critical height, may be determined for which the waveguide 36 will support only the fundamental waveguide mode $E^{Y}_{11}$.

The length of taper, c, is critical to a low loss transition of the waveguided energy to the free space $TE_{10}$ mode of the mixer cavity 14. The waveguide 36, carrying signal energy, is tapered along the H-plane whereas the taper of the waveguide 38 is along the E-plane. The perpendicularity of the tapers 48, 50 results in somewhat of an impedance mismatch therebetween, further preventing signal energy from being coupled into the low frequency LO. (Any RF leaking into the LO will have no effect since the LO may be designed as a high-Q cavity Gunn oscillator, for instance, which will not be perturbed by the low level RF signal power at twice the LO frequency.) The planes of taper are so chosen that the E-field of the RF (transmitted along the waveguide 36) will be coupled readily and with low loss into the mixing cavity 14. The transfer of LO energy is not as efficient. However, the relatively low frequency LO provides an abundance of power and the loss of LO energy does not represent a loss of information to the system.

The waveguide 38, being thicker (higher) than the waveguide 36, is seated in a channel having a trough-like indentation 51. The indentation 51 allows the waveguide 38 to taper to a line substantially coincident with the upper surface of the waveguide 36 and the plane of the ribbon 20, allowing the efficient mixing of energy by the oppositely-poled diodes 16, 18 within the mixing cavity 14.

The closely-spaced diodes 16, 18 are placed a distance d from the tip of the waveguide 38. This distance establishes the voltage standing wave ratio of the RF energy within the mixing cavity 14. By proper choice of this dimension, according to principles well known within the art, one may assure reflection of any signal energy passing the diode pair, providing further assurance that signal will not be dissipated in the low frequency LO. The width, e, of the mixing cavity 14 is selected to permit the cavity 14 to support (that is, the cut-off frequency will be above) the LO frequency $TE_{10}$ mode, as the cavity 14 acts, in effect, as a waveguide. Needless to say, the signal frequency, being greater than the LO, is also supported by the cavity 14. Finally, the height, f, of the cavity 14, sets its impedance. This distance is selected for an impedance match between the cavity 14 and the mixer diode pair so that energy within the cavity will not be reflected from the diode pair.

Referring now to FIG. 2b, a sectional view of the mixer 10 taken along the line 2b—2b of FIG. 2a, one can see a modular IF amplifier 52 situated in a portion of the substrate 12. The amplifier 52, a conventional modular amplifier such as the UTO-511 produced by the Avantek Corporation, has three metallic leads, two of which are shown as the leads 54, 56. These are in electrical contact with the terminals (shown and discussed with respect to FIG. 1) of the printed circuit board 22. The amplifier 52 is thereby functionally and structurally mounted to the board 22. Thus, it is seen that the substrate 12 of the mixer 10 may be utilized to operationally accomodate (the leads are in contact solely with the terminals 24, 26, 28, thus isolating the amplifier 52 from the ground plane cladding 35) the modular component. Alternatively and equivalently an IF amplifier of the flat-packaged variety might be advantageously employed to form the planar millimeter wave-mixer-amplifier unit of the invention.

In operation, RF energy (which may represent, for instance, azimuthal monopulse radar information) is transmitted along the dielectric waveguide 36; likewise LO energy, at approximately one-half the RF signal frequency, is transmitted along the dielectric waveguide 38. Both the RF and LO transmissions undergo a dielectric waveguide-to-image guide transition upon application to the mixer 10 module (i.e., upon waveguide contact with the metallic substrate 12) and, subsequently, an image guide-to-metallic waveguide transition upon radiation into the mixing cavity 14. In the mixer cavity 14, the RF (at approximately 94 GHz) and LO signals (at approximately 46.5 GHz), each propagating in the $TE_{10}$ mode, encounter the reverse-poled pair of mixer diodes 16, 18. As mentioned, supra, the mixing cavity 14, the dielectric waveguides 36, 38 and the pair of diodes 16, 18 have been dimensioned to maximize the mixing action of the diode pair. Thus, differential currents will be established in the diodes 16, 18, causing the second harmonic of the LO signal to mix with the incoming RF signal to produce a 1 GHz IF diode pair output. (The theory of subharmonic mixing is well known in the art. An enlightening mathematical discussion thereof is presented in the above-referenced article by Schneider and Snell ("Strip Line Down Converter With Subharmonic Pump") and such article is herein incorporated by reference for the purpose of such theoretical exposition.)

Only the desired IF signal induced at the output of the pair of mixer diodes 16, 18 by the interaction of LO and RF within the mixing cavity 14 is transmitted in a quasi-TEM mode by the microstrip ribbon 20 to the IF amplifier input terminal 24. As above mentioned, the ribbon 20 has been dimensioned to cut off both RF and LO frequencies and undesired harmonics thereof appearing in the output of the diode pair. This signal is then amplified by the IF amplifier 52 to produce the desired IF signal at the output terminal 26 of the printed circuit board 22. Thus, it is seen that there has been brought to the microwave art a harmonic pumped mixer especially adapted to and useful for the processing of millimeter wavelength signals. Utilizing the mixer of the present invention, one may employ millimeter wave energy to, for instance, detect targets shrouded in fog or other media which are impervious to other wavelengths of energy.

The present invention is characterized by low cost modular construction utilizing the simple fabrication inherent in the use of dielectric waveguide and a metallic or metallized substrate block having a plurality of formed indentations. The provision of an area within the substrate for a modular IF amplifier or the like advantageously provides a compact modular unit of great utility.

What is claimed is:

1. A millimeter wave integrated mixer circuit comprising:
   (a) a substrate having a cavity therein, said substrate providing an image plane for said circuit and said cavity providing an area therein for the mixing of local oscillator (LO) and radio frequency (RF) signal energy;
   (b) a first dielectric waveguide member of chosen height and width corresponding to the frequency or frequency range of RF input signals received at one end thereof and having its other end tapered in a predetermined impedance matching configuration where it extends into said cavity;
   (c) a second dielectric waveguide member of a chosen height and width corresponding to the frequency or frequency range of LO signals received at one end thereof and having its other end tapered in a predetermined impedance matching configuration where it extends into said cavity region, said frequency of said LO signals being substantially one-half that of said RF signals;
   (d) first and second reverse poled mixer diodes connected in parallel in said cavity region and positioned adjacent said tapered ends of said dielectric waveguide members to receive both RF and LO signals from said first and second dielectric image guides respectively, and operative to generate an intermediate frequency (IF) signal which is approximately equal in frequency to the RF input signal frequency less twice the frequency of the local oscillator signal.
   (e) means adjacent said substrate and said mixer diodes and conductively coupled to said mixer diodes for conducting IF signal currents away from said mixer cavity.

2. A millimeter wave integrated mixer circuit as defined in claim 1 additionally comprising means adjacent said substrate and conductively coupled to said mixer diodes for conducting IF signal currents generated within said cavity from said cavity region.

3. A millimeter wave integrated mixer circuit as defined in claim 1 further characterized in that the tapered ends of said first dielectric waveguide member and of said second dielectric waveguide member are tapered along mutually orthogonal planes so that an impedance mismatch is provided to prevent the transmission of RF signal energy into said second dielectric waveguide.

4. A millimeter wave integrated mixer circuit as defined in claim 1 further characterized in that there is provided in said substrate a first channel and a second channel to accommodate said first dielectric image guide and said second image guide, said first channel and said second channel each comprising a mode suppressor section adjacent an impedance transformer section whereby the loss of energy in the transition from waveguide mode to cavity mode is minimized.

5. A millimeter wave integrated mixer circuit comprising:
   (a) a substrate having a cavity therein, said substrate providing a mechanical support for said circuit;
   (b) a first dielectric waveguide member of a predetermined height and width having a tapered end;
   (c) a second dielectric waveguide member of a second predetermined height and width and having a tapered end;
   (d) first and second closely spaced reverse poled mixer diodes in said cavity region; and
   (e) the tapered ends of said first and second dielectric waveguide members being oppositely disposed within said cavity so that when RF signal energy is applied to said cavity by said first dielectric waveguide and LO energy is applied to said cavity by said second dielectric waveguide, an output current representing an intermediate frequency (IF) signal will be induced in said pair of mixer diodes.

6. A millimeter wave integrated mixer circuit as defined in claim 5 additionally including a signal processing module adjacent said substrate and conductively coupled to said pair of mixer diodes whereby said IF signal generated within said cavity may be processed within a unified mixer circuit structure.

7. A millimeter wave integrated mixer circuit as defined in claim 6 wherein said signal processing module is mounted flush with the upper surface of said substrate.

8. A millimeter wave integrated mixer circuit as defined in claim 7 wherein said signal processing module further comprises:
  (a) an insulative base, said base being substantially planar and having metallic contact regions, including an output contact, pattered thereon;
  (b) a signal processing component mounted to said base by means of said metallic contacts so that said signal processing component is electrically coupled in a signal path from said pair of mixer diodes to said output contact; and
  (c) said substrate having a pattern of recessed regions in a first surface so that said module is mounted substantially flush with said surface of said metallic substrate in a compact arrangement.

* * * * *